(12) United States Patent
Nagai et al.

(10) Patent No.: US 10,593,481 B2
(45) Date of Patent: Mar. 17, 2020

(54) MULTILAYER CERAMIC CAPACITOR

(71) Applicant: HOLY STONE ENTERPRISE CO., LTD., Taipei (TW)

(72) Inventors: Atsuo Nagai, Taipei (TW); Sheng-Yi Chen, Taipei (TW)

(73) Assignee: HOLY STONE ENTERPRISE CO., LTD., Taipei (TW)

( * ) Notice: Subject to any disclaimer, the term of this patent is extended or adjusted under 35 U.S.C. 154(b) by 0 days.

(21) Appl. No.: 16/260,702

(22) Filed: Jan. 29, 2019

(65) Prior Publication Data

US 2019/0172647 A1 Jun. 6, 2019

Related U.S. Application Data

(63) Continuation of application No. 15/880,027, filed on Jan. 25, 2018, now Pat. No. 10,217,568.

(30) Foreign Application Priority Data

Jan. 25, 2017 (TW) .............................. 106102946 A

(51) Int. Cl.
*H01G 4/005* (2006.01)
*H01G 4/008* (2006.01)
(Continued)

(52) U.S. Cl.
CPC ............... *H01G 4/30* (2013.01); *H01G 4/008* (2013.01); *H01G 4/12* (2013.01); *H01G 4/1227* (2013.01);
(Continued)

(58) Field of Classification Search
CPC .......... H01G 4/005; H01G 4/008; H01G 4/06; H01G 4/12; H01G 4/30
(Continued)

(56) References Cited

U.S. PATENT DOCUMENTS

| 6,316,100 B1* | 11/2001 | Kodas | ...................... | B01J 2/003 |
| | | | | 257/E21.304 |
| 2004/0161608 A1* | 8/2004 | Choi | ........................ | B01J 2/006 |
| | | | | 428/404 |

(Continued)

FOREIGN PATENT DOCUMENTS

JP H053131 A 1/1993

*Primary Examiner* — Xiaoliang Chen
(74) *Attorney, Agent, or Firm* — Muncy, Geissler, Olds & Lowe, PC

(57) ABSTRACT

A multilayer ceramic capacitor and a method of manufacturing the same are disclosed. A base part of the multilayer ceramic capacitor includes ceramic dielectric and inner electrodes formed inside the ceramic dielectric, and a terminal of each of the inner electrodes is exposed out of one of the two opposite sides of the base part, to form inner electrode terminals. First outer electrodes are formed on the two sides of the base part and the outside of the inner electrode terminals, and second outer electrodes are formed on the first outer electrodes. The first outer electrodes and the base part are formed together by sintering manner, and the second outer electrodes are formed by metal powder and resin material, thereby solving the problem that the vitreous component diffuses around, or solving the problem that plating solution permeates into the base part or the ceramic dielectric during plating process.

16 Claims, 5 Drawing Sheets

(51) Int. Cl.
H01G 4/06 (2006.01)
H01G 4/12 (2006.01)
H01G 4/30 (2006.01)
H01G 4/232 (2006.01)
H01G 4/248 (2006.01)
H05K 1/18 (2006.01)

(52) U.S. Cl.
CPC .......... H01G 4/232 (2013.01); H01G 4/2325 (2013.01); H01G 4/248 (2013.01); H05K 1/181 (2013.01); H05K 2201/10015 (2013.01)

(58) Field of Classification Search
USPC .............. 174/260; 361/301.4, 303, 305, 311, 361/321.2; 307/109
See application file for complete search history.

(56) References Cited

U.S. PATENT DOCUMENTS

| | | | | |
|---|---|---|---|---|
| 2005/0011857 A1* | 1/2005 | Borland | ............... | H01G 4/1218 216/13 |
| 2005/0067744 A1* | 3/2005 | Miura | .................... | B32B 18/00 264/619 |
| 2005/0194575 A1* | 9/2005 | Satou | ...................... | H01B 1/16 252/500 |
| 2005/0262966 A1* | 12/2005 | Chandler | ................. | B01J 2/006 75/331 |
| 2006/0208575 A1* | 9/2006 | Orimo | ................. | H01G 4/0085 307/109 |
| 2007/0025056 A1* | 2/2007 | Nishikawa | ........... | H01G 4/0085 361/303 |
| 2007/0203015 A1* | 8/2007 | Tuan | ..................... | C04B 35/468 501/137 |
| 2007/0223177 A1* | 9/2007 | Ito | ........................ | H01G 4/0085 361/321.2 |
| 2007/0236862 A1* | 10/2007 | Ito | ........................ | H01G 4/0085 361/311 |
| 2010/0110608 A1* | 5/2010 | Wei | ..................... | C04B 35/4682 361/321.4 |
| 2012/0154977 A1* | 6/2012 | Hur | ........................ | H01B 1/16 361/303 |
| 2013/0009515 A1* | 1/2013 | Kim | ........................ | H01G 4/30 310/311 |
| 2013/0038980 A1* | 2/2013 | Kim | ..................... | H01G 4/0085 361/301.4 |
| 2013/0045385 A1* | 2/2013 | Kim | ......................... | B22F 1/02 428/403 |
| 2013/0279074 A1* | 10/2013 | Lee | ......................... | H01G 4/30 361/321.2 |
| 2014/0177127 A1* | 6/2014 | Kim | ........................ | H01G 4/30 361/301.4 |
| 2014/0177128 A1* | 6/2014 | Kim | ........................ | H01G 4/12 361/301.4 |
| 2015/0170786 A1* | 6/2015 | Hong | .................... | H01G 4/232 174/260 |
| 2015/0340154 A1* | 11/2015 | Kim | ........................ | H01G 2/14 174/260 |
| 2017/0022608 A1* | 1/2017 | King | .................... | H01G 4/1227 |

* cited by examiner

A — According to a predetermined weight ratio, the primary components including barium titanate and other additive components, solvent, binder and plasticizer are mixed and processed by a ball grinding machine, to produce ceramic slurry B — The ceramic slurry is processed by using scraper of a green tape caster, to form ceramic thin tapes C — A screen printing process is performed on the ceramic thin tapes to form the nickel electrode paste layers, and a drying process is performed on the nickel electrode paste layers, and the dried nickel electrode paste layers are to be sintered to form the inner electrode D — A plurality of ceramic thin tapes are stacked in interval by the staggered manner, and the stacked ceramic thin tapes are pressurized to bond together; next, the pressurized ceramic thin tapes are cut to form the base part of the embryo of the multilayer ceramic capacitor; and, the inner electrode terminal of each of the inner electrodes is exposed out of one of the two opposite sides of the ceramic dielectric of the base part

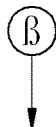

The first outer electrodes on the two opposite sides of the base part are immersed into the metal electrode paste, or the metal electrode paste is directly coated on the two opposite sides of the first outer electrodes; next, a heating process is performed on the metal electrode paste on the two opposite sides, or the base part is placed in environment with about 250℃, thereby solidifying the metal electrode paste to form the second outer electrodes A plating process is performed on outer parts of the second outer electrodes on the two opposite sides of the base part, so as to form the third outer electrodes The multilayer ceramic capacitor of the present invention is completed

FIG. 4

MULTILAYER CERAMIC CAPACITOR

CROSS-REFERENCE TO RELATED APPLICATIONS

This application is a Continuation of co-pending application Ser. No. 15/880,027, filed on Jan. 25, 2018, for which priority is claimed under 35 U.S.C. § 120, and this application claims priority of Application No. 106102946 filed in Taiwan on Jan. 25, 2017, under 35 U.S.C. § 119; the entire contents of all of which are hereby incorporated by reference.

BACKGROUND OF THE INVENTION

1. Field of the Invention

The present disclosure relates to a multilayer ceramic capacitor and a method of manufacturing the same, and more particularly to a multilayer ceramic capacitor including a base part and outer electrode layer formed on two sides of the base part, and the outer electrode layer includes first outer electrodes formed with the base part together by a sintering manner, and second outer electrodes formed by solidifying a mixture of metal powder and resin; the process of forming the first outer electrodes of the outer electrode layer is performed at about 1300° C., and the subsequent process of forming the second outer electrode or the plating process for forming further-outer electrodes is performed at about 250° C. or lower temperature, and the material of the second outer electrode is mixture of resin and metal powder to replace the glass material used in prior art, so as to prevent glass thermal diffusion during the process of forming the second outer electrode, or prevent plating solution or other impurity from penetrating into the ceramic dielectric during sequential process of plating metal film, thereby maintaining entire strength, higher capacitance and higher stability of the multilayer ceramic capacitor.

2. Description of the Related Art

In recent years, electronic products and their related electronic devices must use active and passive components. An active component (such as IC or CPU) can perform arithmetic processing function independently; and compared with the active component, the passive component does not change the resistance or impedance thereof during a change in the current or voltage applied on passive component. The common passive components generally include capacitor, resistor and inductor, which are called the three major passive components. In terms of function, the capacitor stores charges in electrostatic manner and can discharge within a predetermined time, and can be used for filtering or side-wave coordination. Resistors can be used to adjust the voltage and current in the circuit. Inductors can mainly be used to filter current noise or prevent electromagnetic interference. At present, all information devices, communication devices, consumer electronic devices or advanced electronic products are designed to achieve the purpose of electronic loop control by using these three passive components in cooperation with each other. Because of the wide application scope of electronic products, the requirement for capacitors among passive components has been raised, for example, the size of the capacitor is required to be smaller, or the capacitor is required to have higher dielectric stability.

According to the material, the capacitors can be classified into aluminum electrolytic capacitors, ceramic capacitors, plastic film capacitors, tantalum capacitors and mica capacitors. Compared with the electrolytic capacitor and the tantalum capacitor, the ceramic capacitor has characteristics of higher dielectric constant, better insulation, better heat resistance, smaller size, better stability, and better reliability, and is suitable for mass production, and is capable of withstanding higher voltage and higher heat, and operating in a wider temperature range. Furthermore, the ceramic capacitor can be implemented as a chip to be directly soldered by surface mount technology, so manufacturing speed and quantity of the ceramic capacitor is much higher than that of the electrolytic capacitor, the tantalum capacitor and other capacitors. The ceramic capacitors are various, for example, circular plate ceramic capacitor, disc ceramic capacitor, and multi-layer ceramic capacitor are common typical ceramic capacitors available in market.

The multilayer ceramic capacitor mainly includes barium titanate with high dielectric property, and the capacitance of the multilayer ceramic capacitor is usually proportional to a size of a product surface area and a number of stacked layers of ceramic film of the multilayer ceramic capacitor. Generally, the multilayer ceramic capacitor includes inner electrode layers and ceramic dielectric layers stacked in interval by a staggered manner, so as to form capacitors electrically connected in parallel. In other words, each ceramic dielectric layer is sandwiched by the upper and lower electrode layers to form a flat capacitor, and then electrically connected to an outer electrode layer. Therefore, the multilayer ceramic capacitor can be used as a container for storing electricity. The multilayer ceramic capacitor has a larger number of stacked layers of ceramic dielectric layers and inner electrode layers, so the multilayer ceramic capacitors are the most popular and widely used ceramic capacitors in electronic products such as portable high-end electronic products and communication products, for example, PC, mobile phones, automotive electronics and so on.

Japanese Patent Publication No. 5-3131 discloses a multilayer ceramic capacitor including a multilayer body in which inner electrodes and ceramic dielectrics are alternately stacked, and an outer electrode layer. The inner electrode of the multilayer ceramic capacitor is formed by nickel, and the outer electrode layer on two sides of the ceramic dielectric includes first outer electrodes, second outer electrodes formed by combining glass and silver (or silver alloy) at outside of the two first outer electrodes, and third outer electrodes formed by plating metal film on the two second outer electrodes. Because of high sintering temperature, a diffusion layer of nickel oxide may be formed around the area where the ceramic dielectric and the first outer electrode formed by nickel are adjacent to and bonded with each other, so that the bonding strength can be improved. However, during the process of forming the second outer electrodes, the vitreous material may thermally diffuse into the first outer electrode and the ceramic inductor easily because the vitreous material has a very high sintering temperature and long sintering time, and it may reduce the structural strength of multilayer ceramic capacitor or the dielectric. In addition, since the second outer electrode includes both glass powder and silver (or silver alloy) material, uneven distribution of glass powder may occur. When the glass powder accumulates in the periphery of the second outer electrode or is intensively distributed, the plating solution (for example, nickel) may penetrate into the ceramic dielectric easily through diffusion path of the second and first outer electrodes during the process of plating the third outer electrodes on the second outer electrodes, and it may cause bad compactness and poor quality of the multilayer ceramic capacitor and make the multilayer ceramic capacitor fragile and easy to crack. When applied to electronic product, such multilayer ceramic capacitor cannot provide the expected normal function of the multilayer ceramic capacitor, so the conventional multilayer ceramic capacitor are many problems to be solved.

In the process of manufacturing the conventional multilayer ceramic capacitors, multiple heating or sintering processes are performed to produce the multilayer structure of the outer electrodes, but frequent sintering or overheating processes may damage the capacitor, especially the inner electrode and the first outer electrode. In order to produce a high-capacity multilayer ceramic capacitor and increase the number of the stacked inner electrodes, the inner electrodes are designed to be thinner, and it results in a much smaller contact area between each inner electrode and the first outer electrode. In this case, if the already formed first outer electrode is affected by the temperature of the subsequent process to undergo thermal expansion, the original contact part of the first outer electrode with the inner electrode may be damaged or broken to affect the electrical characteristics of the multilayer ceramic capacitor. Furthermore, the outer electrode or the first outer electrode of the conventional multilayer ceramic capacitor may include copper-containing metal or copper. However, the different types of materials have different thermal expansion coefficients, and when the volumes of the heated outer electrode and the heated inner electrode changes, the contact part of the first outer electrode with the inner electrode may also be easily broken.

As mentioned above, the conventional multilayer ceramic capacitor has the above-mentioned problems, in particular, the uneven distribution of glass causes the problem that the plating solution penetrates into the ceramic dielectric during the process of forming the outer electrode, and it causes stability degradation of the conventional multilayer ceramic capacitor. Therefore, what is needed is to solve the problem that the glass powder material or other impurity element may diffuse and penetrate into the multilayer ceramic capacitor.

SUMMARY OF THE INVENTION

In order to solve above-mentioned problems, the inventor develops a multilayer ceramic capacitor to prevent glass material or plating solution from penetrating into the ceramic dielectric, thereby ensuring the multilayer ceramic capacitor to have good structural strength, higher compactness and improved quality and yield.

An objective of the present invention is to provide a multilayer ceramic capacitor comprising a base part and an outer electrode layer. The base part includes ceramic dielectric and a plurality of inner electrodes. The outer electrode layer is formed at two opposite sides of the base part. Each inner electrode comprises an inner electrode terminal exposed out of one of the two opposite sides of the ceramic dielectric, and first outer electrodes formed at the two opposite sides of the ceramic dielectric, and second outer electrodes formed on outside of the first outer electrodes. The first outer electrodes are formed by sintering the base part and the ceramic dielectric, and the first outer electrodes are electrical connected to the inner electrode terminals of the inner electrodes. As a result, in the multilayer ceramic capacitor of the present invention, the first outer electrodes formed on two opposite sides of the base part and the second outer electrodes formed on outside of the first outer electrodes are served as major outer electrode layer structures, and the inner electrode terminals are exposed out of the two opposite sides of the ceramic dielectric, respectively, so that the contact areas between the inner electrodes and the first outer electrodes are increased without limiting the inner electrode terminals, thereby facilitating to manufacture small-size and compact multilayer ceramic capacitor. Furthermore, forming the first outer electrode and the base part in the same sintering process of co-firing can effectively prevent the capacitor or the inner electrode terminals from being broken by the sequential heating process.

In an embodiment, the first outer electrode comprises barium titanate and nickel as primary component, and a volume percentage of barium titanate to nickel is in a range of 15 vol % to 70 vol %, better in a range of 15 vol % to 55 vol %, and preferably in a range of 15 vol % to 50 vol %. Since the component of the first outer electrode is similar to that of the base part, when the capacitor is heated to extended, the changes in volumes of the first outer electrode and the base part are the same or similar, thereby preventing from the damage caused by thermal expansion. In an embodiment, the average particle size of the barium titanate powder and nickel powder used to form the first outer electrode is in a range of 0.3 µm to 1.0 µm, and the preferred particle size is 0.5 µm.

Furthermore, the first outer electrode is required to have special thickness in a range of 5 µm to 70 µm, and, preferably the average thickness is in a range of 5 µm to 50 µm. If the thickness of the first outer electrode coated is higher than 70 µm, the risk of the sintered first outer electrode being peeled off is increased along with the increasing of the thickness; otherwise, if the thickness is lower than 5 µm, the electrical connection between the sintered first outer electrode and the inner electrode may be poor.

In an embodiment, the second outer electrode is formed by metal powder and resin material, and the metal powder is selected from the group consisting of silver powder, nickel powder, tin powder, copper powder and a mixture of nickel powder, and the resin material includes epoxy resin, thermosetting resin or organic adhesive. In an embodiment, a mixture of the resin material and the metal powder having particle size in a range of 0.3 µm to 1.0 µm, can be used to form the second outer electrode which is able to more stably provide electrical connection. Furthermore, since the second outer electrode is formed by uniformly covering the mixture of the metal powder and resin on the first outer electrode, so as to solve the problem that the vitreous component may be unevenly distributed or may diffuse and penetrate into the ceramic dielectric.

In an embodiment, the outer electrode layer further comprises third outer electrodes formed by performing a plating process on outside of the second outer electrodes. The plating manner can be nickel plating manner, tin plating manner or copper plating manner, and the electrical connection can be further extended outwardly through the plating manner. Furthermore, the outer electrode layer of the present invention has a special multilayer structure, and the diffusion path for the plating solution or other impurity element of the third outer electrode can be blocked by the resin material of the second outer electrode, so that the outer electrode layer can be applied on the multilayer ceramic capacitor to solve the problem that the plating solution may diffuse or penetrate into the ceramic dielectric.

The concept of the present invention can be applicable to the multilayer ceramic capacitor provided with a substrate or a circuit board. In an embodiment, the multilayer ceramic capacitor may include a metal substrate, a ceramic substrate or circuit board having conductive line for electrical transmission. The substrate or the circuit board can be directly or indirectly in electrical conduction with the second outer electrodes through the conductive line or solder ball, so that the multilayer ceramic capacitor can be electrically connected to the substrate or the circuit board. Preferably, the substrate can be an aluminum oxide substrate, an aluminum nitride substrate, or other substrate or circuit board having conductive line pattern.

Another objective of the present invention is to provide a method of manufacturing a multilayer ceramic capacitor. In the method, according to a predetermined weight ratio, the primary component, and solvent, binder and plasticizer are mixed and processed by a ball grinding machine, to produce ceramic slurry. The primary component includes barium titanate, manganese oxide, yttrium oxide and silicon oxide. The solvent includes ethanol or toluene. The ceramic slurry is processed, by using scraper of a green tape caster, to form ceramic thin tapes, for example, the ceramic thin tape having a width of 150 mm and a thickness of 10 µm is formed on a PET film. Next, a screen printing process is performed on the ceramic thin tapes to form the nickel electrode paste layers, and a drying process is performed on the nickel electrode paste layers. Preferably, the nickel paste layer includes nickel powder, barium titanate powder, binder and solvent. Preferably, the ceramic thin tape formed on the PET film has a width of 150 mm and a thickness of 6 µm, and can be used to manufacture a 10 µf capacitor with a length 3.2 mm and a width 2.5 mm.

In an embodiment, the printed ceramic thin tapes can be cut into appropriate size, such as a size of 150 mm×150 mm, and the ceramic thin tapes are shifted and stacked alternatively, and the stacked ceramic thin tapes are pressurized and then cut off to obtain the embryo of the multilayer ceramic capacitor. The embryo of the multilayer ceramic capacitor includes inner electrode terminals of the inner electrode exposed out of two side surfaces thereof.

In an embodiment, the embryo and food powder are placed in a container, and the container is rotated to grind corner parts of the base part of the embryo. Next, the side surfaces of the embryo are immersed into nickel paste. After the embryo is immersed into nickel paste, the coating process and drying process are performed on the side surfaces of the embryo. The thickness of the coated nickel paste is in a range of 5 µm to 70 µm, and preferably, the average thickness is in a range of 5 µm to 50 µm. The nickel paste includes barium titanate powder and nickel powder both having particle size in a range of 0.3 µm to 1.0 µm, and the preferred particle size is 5 µm. In an embodiment, the volume percentage of barium titanate powder to nickel powder is in a range of 15 vol % to 70 vol %, preferably in a range of 15 vol % to 55 vol %, and optimally in a range of 15 vol % to 50 vol %.

The dried embryo is placed in nitrogen environment, and a degreasing process is performed on the embryo at about 400° C., so as to control hydrogen/water vapor content particularly, and the embryo is then sintered at 1300° C. in reduction atmosphere of which equilibrium oxygen partial pressure is lower than the equilibrium oxygen partial pressure for nickel by at least one order of magnitude. The embryo and the nickel paste coated on two opposite sides of the embryo are sintered together. After the sintering process, the embryo forms the base part of the multilayer ceramic capacitor, and the nickel paste coated on the two opposite sides of the embryo forms the first outer electrodes of the outer electrode layer, and the first outer electrodes are electrically connected to the inner electrode terminals of the inner electrode inside the ceramic dielectric of the base part.

The condition of performing the degreasing process can be appropriately determined upon the types of the binder and the plasticizer. The highest sintering temperature can be determined upon the type of the ceramic material to obtain better compactness, but it should be noted that if the first outer electrode is sintered in atmosphere where nickel may be oxidized, the first outer electrode may also be oxidized and fail in providing nice electrical conduction.

In an embodiment, the first outer electrode on two opposite sides of the base part is immersed into metal electrode paste, and the metal electrode paste can be dried at about 100° C. to 150° C. for 30 minutes in atmospheric environment, and then be hardened at 220° C. to 270° C. in nitrogen environment to form the second outer electrodes. Preferably, the metal powder can be silver powder, nickel powder, tin powder, copper powder or a mixture of nickel powder, and the metal electrode paste includes metal powder, thermosetting resin, epoxy resin and organic binder. When the drying temperature is higher than 150° C., the copper powder is over-oxidized, and the hardened metal electrode paste may be in poor conduction with the first outer electrode; for this reason, the drying process is performed at 120° C., preferably. In an embodiment, the metal electrode paste is hardened in nitrogen environment in a range of 240° C. to 270° C., in order to make the outer electrode layer have nice fixing strength for bonding and conduction.

When the second outer electrodes are formed on outside of the first outer electrodes on two opposite sides of the base part, respectively, the plating process is performed on outside of the second outer electrodes on the two opposite sides of the base part to form the third outer electrodes. Preferably, the plating process can be nickel plating process, tin plating process or copper plating process.

BRIEF DESCRIPTION OF THE DRAWINGS

The structure, operating principle and effects of the present disclosure will be described in detail by way of various embodiments which are illustrated in the accompanying drawings.

FIG. 2 is a first part of a flowchart of a method of manufacturing a multilayer ceramic capacitor of the present invention.

FIG. 4 is a third part of the flowchart of the method of manufacturing the multilayer ceramic capacitor of the present invention.

DETAILED DESCRIPTION OF THE PREFERRED EMBODIMENTS

Figure 1:
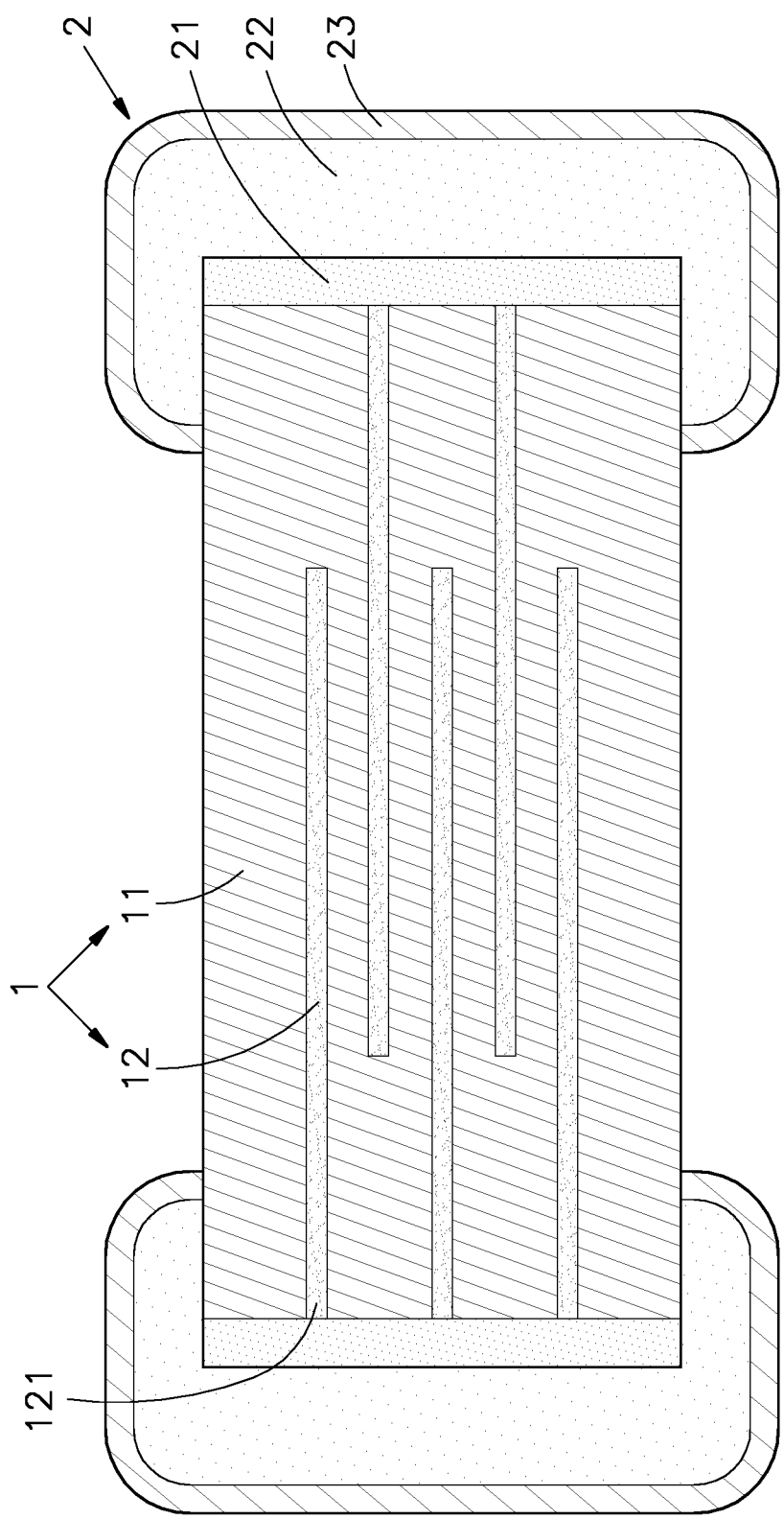
FIG. 1 is a sectional side view of a multilayer ceramic capacitor of a preferred embodiment of the present invention.

Please refer to FIGS. 1, 2, 3 and 4, which are sectional side view of a multilayer ceramic capacitor of a preferred embodiment of the present invention, and a first, second and third parts of a flowchart of a method of manufacturing the multilayer ceramic capacitor of the present invention. As shown in FIG. 1, the multilayer ceramic capacitor includes a base part 1 and an outer electrode layer 2 formed on two opposite sides of the base part 1.

In order to form the base part 1, a plurality of ceramic thin tapes are arranged in interval by a staggered manner, to stack in a multi-layer structure, and the stacked layers are pressurized to bond together, and then cut to form the base part 1 of an embryo of the multilayer ceramic capacitor. The base part 1 includes ceramic dielectric 11 and a plurality of inner electrodes 12 formed inside the ceramic dielectric 11. Each of the inner electrodes 12 includes an inner electrode terminal 121 formed a side thereof and exposed out one of the two opposite sides of the ceramic dielectric 11.

The outer electrode layer 2 includes first outer electrodes 21 formed on the two opposite sides of the ceramic dielectric 11 of the base part 1, and second outer electrodes 22 formed at outside of the first outer electrodes 21, and third outer electrodes 23 formed at outside of the second outer electrodes 22. The two first outer electrodes 21 are electrically connected to the inner electrode terminals 121 of the inner electrodes 12 formed on two opposite sides of the ceramic dielectric 11, respectively. The second outer electrode 22 is formed by solidifying components including metal powder and resin.

Aforementioned the base part 1 can be the embryo of the multilayer ceramic capacitor which includes the ceramic dielectric 11 including barium titanate as primary component, and the inner electrodes 12 including nickel as primary component. The first outer electrode 21 of the outer electrode layer 2 includes nickel and barium titanate as primary components, and the third outer electrode 23 can be a plating layer formed by plating process and including nickel and tin as primary components.

Figure 3:
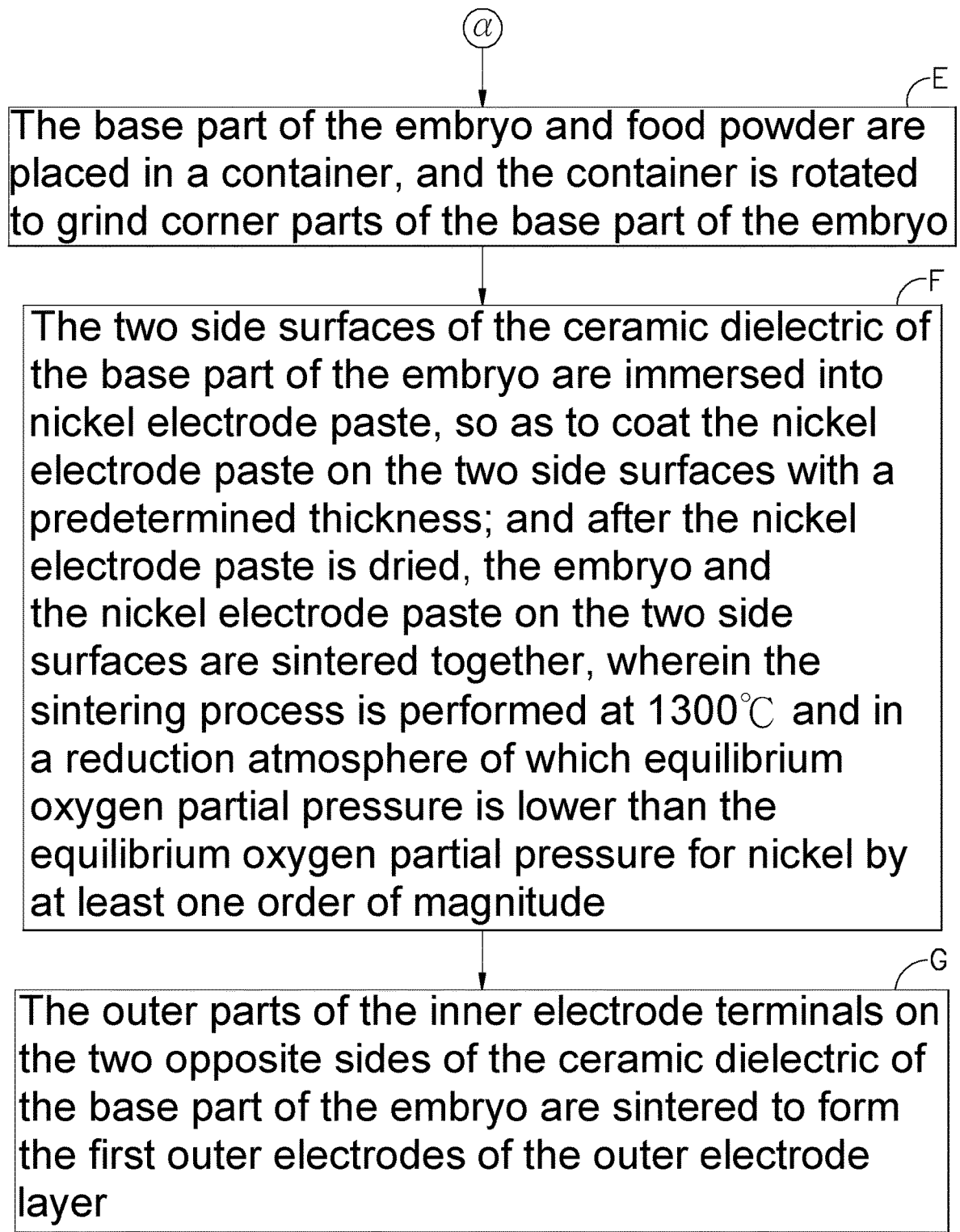
FIG. 3 is a second part of the flowchart of the method of manufacturing the multilayer ceramic capacitor of the present invention.

Please refer to FIGS. 2, 3 and 4, which show first, second and third parts of the flowchart of the method of manufacturing the multilayer ceramic capacitor, according to an embodiment of the present invention. The method of manufacturing the base part 1 and the outer electrode layer 2 include steps (A) to (J).

In the step (A), according to a predetermined weight ratio, the primary components including barium titanate and other additive components, solvent, binder and plasticizer are mixed and processed by a ball grinding machine, to produce ceramic slurry.

In the step (B), the ceramic slurry is processed by using scraper of a green tape caster, to form ceramic thin tapes.

In the step (C), a screen printing process is performed on the ceramic thin tapes to form the nickel electrode paste layers, and a drying process is performed on the nickel electrode paste layers, and the dried nickel electrode paste layers are to be sintered to form the inner electrode 12.

In the step (D), the plurality of ceramic thin tapes are stacked in interval by the staggered manner, and the stacked ceramic thin tapes are pressurized to bond together; next, the pressurized ceramic thin tapes are cut to form the base part 1 of the embryo of the multilayer ceramic capacitor. The inner electrode terminal 121 of each of the inner electrodes 12 is exposed out of one of the two opposite sides of the ceramic dielectric 11 of the base part 1.

In the step (E), the base part 1 of the embryo and food powder are placed in a container, and the container is rotated to grind corner parts of the base part 1 of the embryo.

In the step (F), the two side surfaces of the ceramic dielectric 11 of the base part 1 of the embryo are immersed into nickel electrode paste, so as to coat the nickel electrode paste on the two side surfaces with a predetermined thickness; and after the nickel electrode paste is dried, the embryo and the nickel electrode paste on the two side surfaces are sintered together. The sintering process is performed at 1300° C. and in a reduction atmosphere of which equilibrium oxygen partial pressure is lower than the equilibrium oxygen partial pressure for nickel by at least one order of magnitude.

In the step (G), the outer parts of the inner electrode terminals 121 on the two opposite sides of the ceramic dielectric 11 of the base part 1 of the embryo are sintered to form the first outer electrodes 21 of the outer electrode layer 2.

In the step (H), the first outer electrodes 21 on the two opposite sides of the base part 1 are immersed into the metal electrode paste, or the metal electrode paste is directly coated on the two opposite sides of the first outer electrodes 21; next, a heating process is performed on the metal electrode paste on the two opposite sides, or the base part 1 is placed in environment with about 250° C., thereby solidifying the metal electrode paste to form the second outer electrodes 22.

In the step (I), a plating process is performed on outer parts of the second outer electrodes 22 on the two opposite sides of the base part 1, so as to form the third outer electrodes 23.

In the step (J), the multilayer ceramic capacitor of the present invention is completed.

In an embodiment, the primary component described in the step (A) can be barium titanate, manganese oxide, yttrium oxide or silicon oxide, and the solvent can include ethanol, toluene or a mixture thereof, and the primary component is mixed with the solvent, binder and plasticizer by the ball grinding machine, thereby producing the ceramic slurry.

In an embodiment, the ceramic slurry described in the step (B) is shaped, by the scraper of the green tape caster, as the ceramic thin tape with a width about 150 mm and a thickness about 10 μm, on PET plastic film. Preferably, the ceramic thin tape can have a width about 150 mm and a thickness 6 and used to manufacture a 10 μF capacitor with a length 3.2 mm and a width 2.5 mm.

In an embodiment, in the step (C), the nickel electrode paste used to form the inner electrode 12 can include nickel powder, barium titanate powder, adhesive and solvent.

In an embodiment, the ceramic thin tape described in the step (D) can be cut into a size of 150 mm×150 mm of size. The plurality of ceramic thin tapes are arranged in interval by a staggered manner to stack, and the stacked ceramic thin tapes are pressurized to bond together and then cut to form the base part 1 of the embryo of the multilayer ceramic capacitor. The base part 1 of the embryo of the multilayer ceramic capacitor include the ceramic dielectric 11 and the plurality of inner electrodes 12, and the inner electrode terminals 121 of the inner electrodes 12 are exposed out of the two opposite side surfaces of the ceramic dielectric 11, respectively.

In an embodiment, the nickel electrode paste described in the step (F) can include nickel powder and barium titanate powder, and a particle size of nickel powder and barium titanate powder is in a range of 0.3 μm to 1.0 μm and the preferred particle size is 0.5 The volume percentage of the nickel powder to barium titanate powder is in a range of 15 vol % to 70 vol %, and preferably, in a range of 15 vol % to 55 vol %, and optimally, in a range of 15 vol % to 50 vol %. In an embodiment, the thickness of the nickel electrode paste coated can be in a range of 5 μm to 70 μm and preferred average thickness is in a range of 5 μm to so that the multilayer ceramic capacitor can have better stability of electrical characteristics. However, when the thickness of the nickel electrode paste coated is higher than 70 μm, the first outer electrode 21 may be peeled off after the sintering process. Similarly, when the thickness of the nickel electrode paste coated is lower than 5 μm, the electric connection between the first outer electrode 21 and the inner electrode terminals 121 of the inner electrodes 12 may be poor, and it reduces stability of the electrical characteristics of the product.

In an embodiment, the base part 1 of the embryo described in the step (F) is immersed into the nickel electrode paste for coating, and after the coated nickel electrode paste is dried, the base part 1 of the embryo is placed in nitrogen environment and the degreasing process is performed on the base part 1 at about 400° C., so as to control hydrogen/water vapor content; next, the sintering process is performed on the base part 1 at about 1300° C. in the reduction atmosphere of which equilibrium oxygen partial pressure is lower than the equilibrium oxygen partial pressure for nickel by at least one order of magnitude, so as to form the base part 1 of the embryo and the first outer electrodes 21 on the two opposite sides of the ceramic dielectric 11 described in the step (G). The base part 1 of the embryo includes the ceramic dielectric 11 and the plurality of inner electrodes 12, and the inner electrode terminals 121 of the plurality of inner electrodes 12 are exposed out of the two opposite side surfaces of the ceramic dielectric 11, respectively. When the first outer electrodes 21 are sintered at about 1300° C. to form on the two opposite sides of the ceramic dielectric 11, the first outer electrode 21 can be prevented from being fragile or having crack. Particularly, the sintered first outer electrode 21 has excellent compactness to provide better electrical conduction with the inner electrode terminals 121 on the two opposite side surfaces of the ceramic dielectric 11. Furthermore, the condition of performing the degreasing process can be appropriately determined upon the types of the binder and the plasticizer. The highest sintering temperature can be determined upon the type of the ceramic material to obtain better compactness, but it should be noted that if the first outer electrode 21 is sintered in atmosphere where nickel may be oxidized, the first outer electrode 21 may also be oxidized and fail in providing nice electrical conduction.

In an embodiment, the metal electrode paste described in the step (H) includes metal powder, thermosetting resin, epoxy resin, organic adhesive, and can be dried at about 100° C. to 150° C. for 30 minutes in atmospheric environment, and then be hardened at 220° C. to 270° C. in nitrogen environment to form the second outer electrodes 22 on outside of the first outer electrodes 21 on two opposite sides of the ceramic dielectric 11 of the base part 1 of the embryo. Preferably, the metal powder of the metal electrode paste can be copper powder, silver powder, or mixture of silver powder and nickel powder. The second outer electrode 22 is solidified and formed at about 250° C. far lower than the sintering temperature, so that the metal powder can be prevented from diffusing or penetrating into the first outer electrode 21, the ceramic dielectric 11 or the inner electrode 12 during the process of forming the second outer electrode 22, and the performance of structural strength or electrical conduction of the first outer electrode 21, the ceramic dielectric 11 or the inner electrode 12 can be protected from being affected.

In an embodiment, in the step (I), the nickel plating process or tin plating process can be performed on outside of the second outer electrodes 22 on two opposite sides of the ceramic dielectric 11 of the base part 1, thereby forming the third outer electrodes 23. After the first outer electrodes 21, the second outer electrodes 22 and the third outer electrodes 23 are formed on the two opposite sides of the ceramic dielectric 11 of the base part 1, the multilayer ceramic capacitor of the present invention having improved structural strength and stability is completed.

In the process of manufacturing the multilayer ceramic capacitor of the present invention, the second outer electrodes 22 of the outer electrode layer 2 is formed by metal electrode paste including metal powder and resin. Preferably, the metal powder can be copper powder, silver powder or mixture of silver powder and nickel powder. The sequential solidification process is performed at lower temperature, such as at about 250° C. in nitrogen environment, so the problem of the metal powder diffusing around can be prevented. Furthermore, the resin material of the second outer electrode 22 has property of stopping diffusion of metal element, so that during the plating process performed on outside of the second outer electrode 22 on the two opposite sides of the ceramic dielectric 11 of the base part 1 to form the third outer electrode 23, the plating solution can be prevented from penetrating into the second outer electrode 22, the first outer electrode 21, the ceramic dielectric 11 or the inner electrode 12, thereby maintaining the structural strength and good capacitor performance of the multilayer ceramic capacitor.

Figure 5:
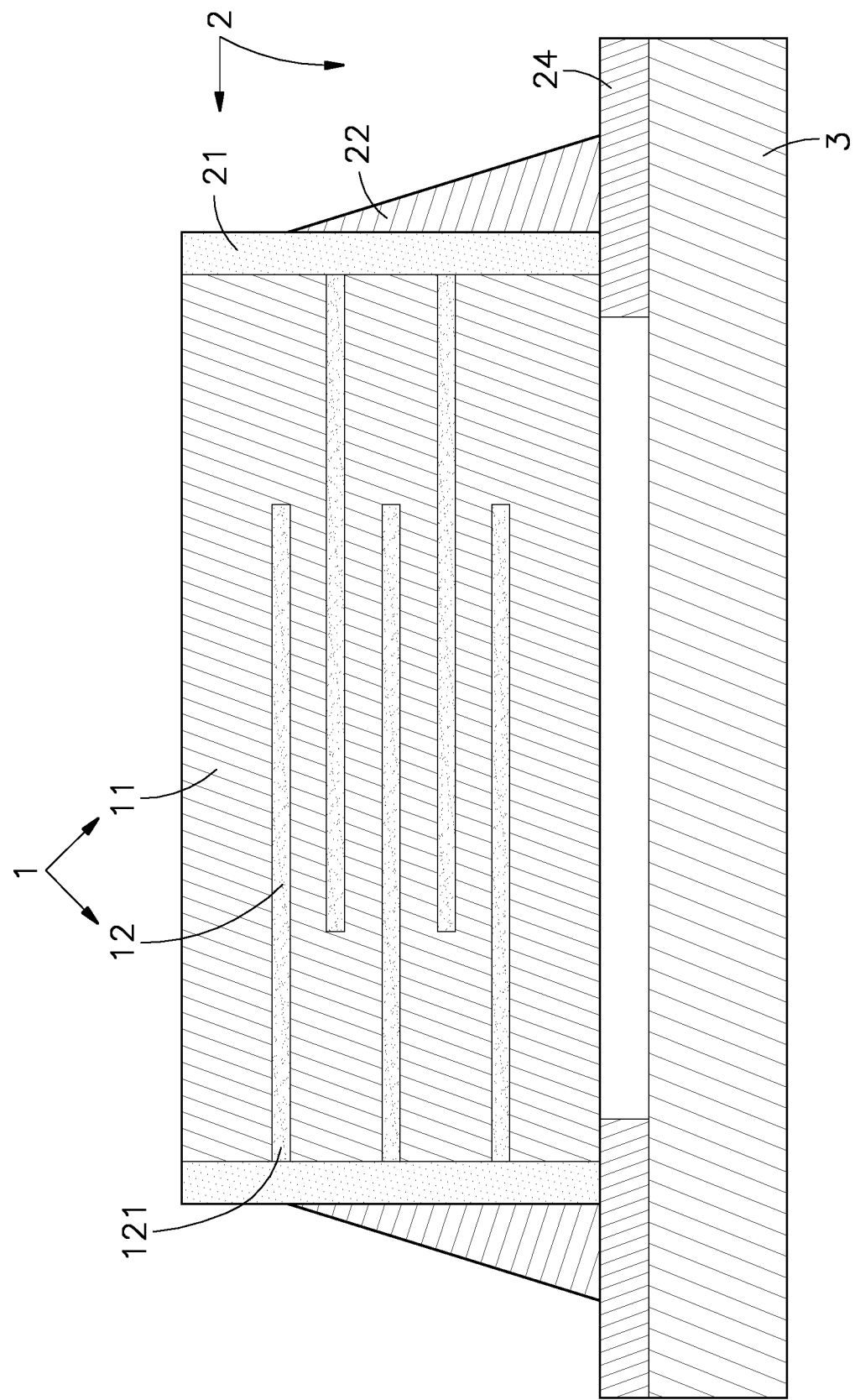
FIG. 5 is a sectional side view of a multilayer ceramic capacitor of another embodiment of the present invention.

Please refer to FIG. 5, which is a sectional side view of a multilayer ceramic capacitor of another embodiment of the present invention. In this embodiment, the multilayer ceramic capacitor is provided with a substrate, and includes the base part 1, the outer electrode layer 2 formed on two opposite sides of the base part 1, and an aluminum oxide substrate 3 attached with the outer electrode layer 2.

In the base part 1, the plurality of ceramic thin tapes are arranged in interval by a staggered manner and are stacked in the multilayer structure, and the stacked ceramic thin tapes are pressurized to bond together and then cut to form the base part 1 of the embryo of the multilayer ceramic capacitor. The base part 1 includes the ceramic dielectric 11 and the plurality of inner electrodes 12 formed in the ceramic dielectric 11, and the inner electrode terminals 121 of the inner electrodes 12 are exposed out of the two opposite sides of the ceramic dielectric 11, respectively.

The outer electrode layer 2 includes the first outer electrodes 21 formed on the two opposite sides of the ceramic dielectric 11 of the base part 1 and the second outer electrodes 22 formed on outside of the two first outer electrodes 21. The first outer electrodes 21 are in electrical conduction with both of the inner electrode terminals 121 and the second outer electrodes 22 on the two opposite side surfaces of the ceramic dielectric 11. The outer electrode layer 2 is soldered on the aluminum oxide substrate 3, and lines 24 are disposed at the positions where the aluminum oxide substrate 3 and the outer electrode layer 2 are attached with each other, so that the two first outer electrodes 21 or the second outer electrodes 22 can be in electrical conduction with the aluminum oxide substrate 3 through the lines 24, thereby forming the multilayer ceramic capacitor of another embodiment of the present invention.

Besides aluminum oxide, the aluminum oxide substrate 3 under the two first outer electrodes 21 can be a metal plate such as copper plate or tin plate, or a circuit board provided with circuit layout.

As a result, the concept of the present invention can be applicable to numerous embodiments of the multilayer ceramic capacitor, and the design directed to the structure of the multilayer ceramic capacitor is the preferred embodiment. The ceramic dielectric 11 of the base part 1 includes the plurality of inner electrodes 12 disposed inside, and the inner electrode terminal 121 of a side of each of the inner electrodes 12 is exposed out of one of the two opposite side surfaces of the ceramic dielectric 11. The first outer electrodes 21, the second outer electrodes 22 and the third outer electrodes 23 of the outer electrode layer 2 are formed at outside of the two opposite side surfaces of the ceramic dielectric 11, so as to complete the multilayer ceramic capacitor. Preferably, the second outer electrodes 22 are formed by metal powder and resin which are solidified at lower temperature, so as to achieve the main concept of preventing the second outer electrode 22 from diffusing around. During the process of performing the plating process on outside of the second outer electrode 22 on the two opposite sides of the base part 1 to form the third outer electrodes 23, the plating solution is prevented from penetrating into the second outer electrode 22, the first outer electrode 21, the ceramic dielectric 11 or the inner electrode 12, thereby ensuring the multilayer ceramic capacitor to have better compactness, improved structural strength and higher stability. However, the above content is merely for illustration of preferred embodiment of the multilayer ceramic capacitor of the present invention and not intended to limit the claim scope of the present invention. Numerous modifications, variations and enhancements can be made thereto by those skilled in the art without departing from the spirit and scope of the disclosure set forth in the claims.

In order to prove the capacitor strength and stability of the multilayer ceramic capacitor of the present invention, multiple experiments are performed by using nickel powder and barium titanate powder with average powder particle size of 0.5 μm and different volume percentages, so as to compare insulation resistance degradation rates of the first outer electrodes and electrostatic capacities of the capacitors with the sintered first outer electrode having different thickness. The experiment results are shown in table one below. In a case that the volume percentage of barium titanate to nickel is 15:85 (that is, 15 vol % barium titanate and 85 vol % nickel by volume) and the sintered first outer electrode has thickness of 5 μm, 20 μm or 50 μm, the electrostatic capacity of the capacitor can be higher than 10.0 μF and the problem of the first outer electrode being peeled off does not occur. When the first outer electrode has a thickness of 20 μm, the experiment result shows that no experimental product has defect or insulation resistance degradation among all 80 experimental products. In a case that the volume percentage of barium titanate to nickel is 20:80 (that is, 20 vol % barium titanate and 80 vol % nickel by volume) and the first outer electrode has 5 μm, 20 μm or 50 μm of thickness, the electrostatic capacity of the capacitor can be higher than 10.0 μF and the problem of the first outer electrode being peeled off does not occur; furthermore, when the first outer electrode has 5 μm, 20 μm or 50 μm of thickness, the experiment result shows that no experimental product has defect or insulation resistance degradation among all 80 experimental products. In a case that the volume percentage of barium titanate to nickel is 50:50 (that is, 50 vol % barium titanate and 50 vol % nickel by volume) and the sintered first outer electrode has 5 μm. 20 μm or 50 μm of thickness, the electrostatic capacity of the capacitor can be higher than 10.0 μF and the problem of the first outer electrode being peeled off does not occur; furthermore, when the first outer electrode has 5 μm, 20 μm or 50 μm of thickness, the experiment result shows that no experimental product has defect or insulation resistance degradation among all 80 experimental products. In a case that the volume percentage of barium titanate to nickel is 55:45 (that is, 55 vol % barium titanate and 45 vol % nickel by volume) and the sintered first outer electrode has 5 μm 20 μm or 50 μm of thickness, the electrostatic capacity of the capacitor can be higher than 9.0 μF.

TABLE ONE test for electrostatic capacity and resistance degradation rate of capacitor

| barium titanate(BT)/ nickel(Ni) | The thickness of the first outer electrode sintered | The electrostatic capacity of the capacitor | The resistance degradation rate after 1000 hours |
|---|---|---|---|
| 15/85 (Ni = 0.5 μm and BT = 0.5 μm) | 3 μm | < 9 μF | — |
|  | 5 μm | 10.0 μF | — |
|  | 20 μm | 10.5 μF | 0/80 |
|  | 50 μm | 10.6 μF | — |
|  | 70 μm | The first outer electrode is peeled off | — |
| 20/80 (Ni = 0.5 μm and BT = 0.5 μm) | 3 μm | < 9 μF | — |
|  | 5 μm | 10.0 μF | 0/80 |
|  | 20 μm | 10.1 μF | 0/80 |
|  | 50 μm | 10.2 μF | 0/80 |
|  | 70 μm | The first outer electrode is peeled off | — |
| 50/50 (Ni = 0.5 μm and BT = 0.5 μm) | 3 μm | < 9 μF | — |
|  | 5 μm | 9.8 μF | 0/80 |
|  | 20 μm | 10.0 μF | 0/80 |
|  | 50 μm | 10.2 μF | 0/80 |
|  | 70 μm | 10.5 μF | — |
| 55/45 (Ni = 0.5 μm and BT = 0.5 μm) | 3 μm | < 9 μF | — |
|  | 5 μm | 9.0 μF | — |
|  | 20 μm | 9.5 μF | 0/80 |
|  | 50 μm | 9.6 μF | — |
|  | 70 μm | 9.9 μF | — |

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A multilayer ceramic capacitor, comprising:
   a base part comprising ceramic dielectric and a plurality of inner electrodes;
   an outer electrode layer formed at two opposite sides of the base part;
   wherein each of the plurality of inner electrodes comprises an inner electrode terminal exposed out of one of the two opposite sides of the ceramic dielectric, and the outer electrode layer comprises first outer electrodes formed at the two opposite sides of the base part and second outer electrodes formed on outside of the first outer electrodes;
   wherein the first outer electrodes are formed by sintering the base part and powder of nickel and barium titanate with particle size in 0.3 μm, and the first outer electrodes are electrical connected to the inner electrode terminals at the sides of the inner electrodes.

2. The multilayer ceramic capacitor according to claim 1, wherein the first outer electrode comprises dielectric layer comprising barium titanate and nickel as primary component, and a volume percentage of barium titanate to nickel is in range of 15 vol % to 55 vol %.

3. The multilayer ceramic capacitor according to claim 2, wherein the volume percentage of barium titanate to nickel is in range of 15 vol % to 50 vol %.

4. The multilayer ceramic capacitor according to claim 2, wherein a thickness of the first outer electrode is in range of 5 μm to 70 μm.

5. The multilayer ceramic capacitor according to claim 4, wherein a second outer electrode is formed by metal powder and resin material, and the metal powder is selected from the group consisting of silver powder, nickel powder and copper powder, and a particle size of the metal powder is in range of 0.3 μm to 1.0 μm.

6. The multilayer ceramic capacitor according to claim 5, wherein an outer electrode layer further comprises third outer electrodes formed by performing a plating process on outside of the second outer electrodes.

7. The multilayer ceramic capacitor according to claim 5, further comprising a substrate or a circuit board, wherein the substrate or the circuit board comprises at least one conductive line electrically connected to the second outer electrode.

8. The multilayer ceramic capacitor according to claim 4, wherein second outer electrodes are formed by metal powder and resin material, and the metal powder is selected from the group consisting of silver powder, nickel powder and the copper powder, and includes a particle size of the metal powder in a range of 0.3 μm to 1.0 μm.

9. A multilayer ceramic capacitor, comprising:
 a base part comprising ceramic dielectric and a plurality of inner electrodes;
 an outer electrode layer formed at two opposite sides of the base part;
 wherein each of the plurality of inner electrodes comprises an inner electrode terminal exposed out of one of the two opposite sides of the ceramic dielectric, and the outer electrode layer comprises first outer electrodes formed at the two opposite sides of the base part and second outer electrodes formed on outside of the first outer electrodes;
 wherein the first outer electrodes are formed by sintering the base part and powder of nickel and barium titanate with the same particle size, which is in a smaller range than 1.0 μm, and the first outer electrodes are electrical connected to the inner electrode terminals at the sides of the inner electrodes.

10. The multilayer ceramic capacitor according to claim 9, wherein the first outer electrode comprises dielectric layer comprising barium titanate and nickel as primary component, and a volume percentage of barium titanate to nickel is in range of 15 vol % to 55 vol %.

11. The multilayer ceramic capacitor according to claim 10, wherein the volume percentage of barium titanate to nickel is in range of 15 vol % to 50 vol %.

12. The multilayer ceramic capacitor according to claim 10, wherein a thickness of the first outer electrode is in range of 5 μm to 70 μm.

13. The multilayer ceramic capacitor according to claim 12, wherein a second outer electrode is formed by metal powder and resin material, and the metal powder is selected from the group consisting of silver powder, nickel powder and copper powder, and a particle size of the metal powder is in range of 0.3 μm to 1.0 μm.

14. The multilayer ceramic capacitor according to claim 13, wherein an outer electrode layer further comprises third outer electrodes formed by performing a plating process on outside of the second outer electrodes.

15. The multilayer ceramic capacitor according to claim 13, further comprising a substrate or a circuit board, wherein the substrate or the circuit board comprises at least one conductive line electrically connected to the second outer electrode.

16. The multilayer ceramic capacitor according to claim 12, wherein second outer electrodes are formed by metal powder and resin material, and the metal powder is selected from the group consisting of silver powder, nickel powder and the copper powder, and includes a particle size of the metal powder in a range of 0.3 μm to 1.0 μm.

* * * * *